US011122711B2

(12) United States Patent
Kinoshita et al.

(10) Patent No.: US 11,122,711 B2
(45) Date of Patent: Sep. 14, 2021

(54) ELECTRONIC APPARATUS AND ELECTRONIC UNIT

(71) Applicant: FUJITSU LIMITED, Kawasaki (JP)

(72) Inventors: Tetsuhiro Kinoshita, Inagi (JP); Takashi Urai, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/838,063

(22) Filed: Apr. 2, 2020

(65) Prior Publication Data

US 2020/0329587 A1   Oct. 15, 2020

(30) Foreign Application Priority Data

Apr. 10, 2019  (JP) .............................. JP2019-074988

(51) Int. Cl.
*H05K 7/20* (2006.01)
*H05K 7/14* (2006.01)

(52) U.S. Cl.
CPC ....... *H05K 7/20727* (2013.01); *H05K 7/1487* (2013.01); *H05K 7/20145* (2013.01); *H05K 7/20172* (2013.01)

(58) Field of Classification Search
CPC ............. H05K 7/20727; H05K 7/1487; H05K 7/20145; H05K 7/20172
See application file for complete search history.

(56) References Cited

U.S. PATENT DOCUMENTS

| 6,678,157 | B1 * | 1/2004 | Bestwick | G06F 1/20 165/104.34 |
|---|---|---|---|---|
| 9,086,861 | B2 * | 7/2015 | Yang | G06F 1/20 |
| 9,578,786 | B1 * | 2/2017 | Beall | H05K 7/20754 |
| 9,750,128 | B2 * | 8/2017 | Endo | H05K 1/0203 |
| 2012/0147549 | A1 * | 6/2012 | Wu | G06F 1/18 361/679.33 |
| 2018/0376611 | A1 * | 12/2018 | Madanipour | H05K 7/20709 |

FOREIGN PATENT DOCUMENTS

| JP | 2003-324292 A | 11/2003 |
|---|---|---|
| JP | 2006-202822 A | 8/2006 |

* cited by examiner

*Primary Examiner* — Mukundbhai G Patel
(74) *Attorney, Agent, or Firm* — Fujitsu Patent Center

(57) ABSTRACT

An electronic unit to be stored in a first storage section of an electronic device that includes the first storage section on a first side and a second storage section on a second side opposite to the first side, the electronic unit includes a first board on which a first heating element is mounted; a first connector disposed at an end on the first side of the first board; and a duct disposed at the end on the first side of the first board, the duct having a guide surface that guides wind to the first heating element as a fan of the electronic device operates.

4 Claims, 14 Drawing Sheets

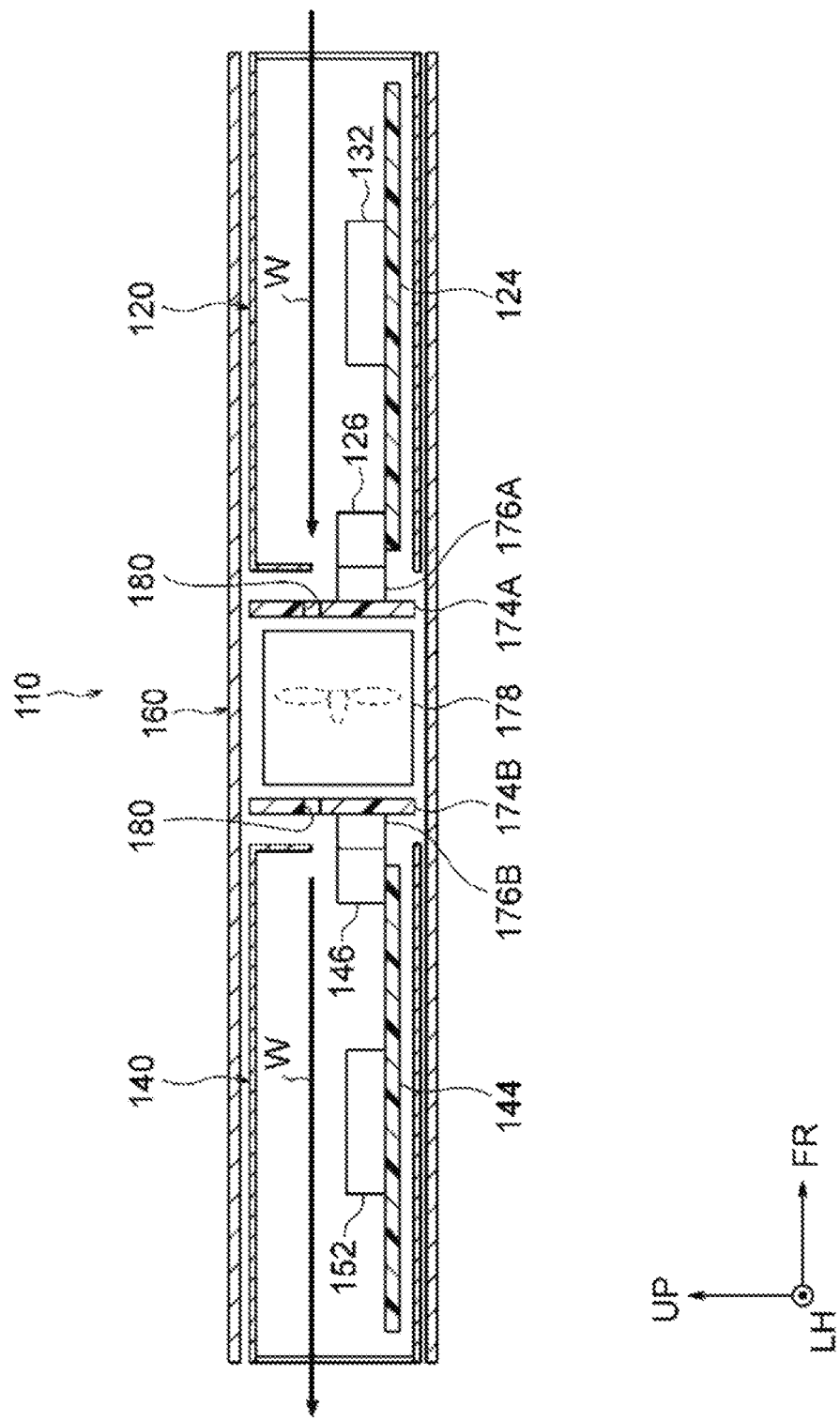

ELECTRONIC APPARATUS AND ELECTRONIC UNIT

CROSS-REFERENCE TO RELATED APPLICATION

This application is based upon and claims the benefit of priority of the prior Japanese Patent Application No. 2019-74988, filed on Apr. 10, 2019, the entire contents of which are incorporated herein by reference.

FIELD

The technology disclosed in the present application is related to an electronic apparatus and an electronic unit.

BACKGROUND

There is an electronic apparatus that includes a first unit, a second unit, and an electronic device storing the first unit and the second unit arranged in the front-back direction (for example, see Patent Documents 1 and 2).

In the electronic apparatus, the first unit includes a first board on which a first heating element is mounted. In addition, the second unit includes a second board on which a second heating element is mounted. The electronic device includes a relay board. The first board and the second board are connected to the relay board via a connector. The electronic device includes a fan. The first heating element and the second heating element are cooled by wind that is generated as the fan operates. For example, Japanese Laid-open Patent Publication No. 2003-324292, Japanese Laid-open Patent Publication No. 2006-202822, and the like are disclosed as related art.

SUMMARY

According to an aspect of the embodiments, an electronic unit to be stored in a first storage section of an electronic device that includes the first storage section on a first side and a second storage section on a second side opposite to the first side, the electronic unit includes a first board on which a first heating element is mounted; a first connector disposed at an end on the first side of the first board; and a duct disposed at the end on the first side of the first board, the duct having a guide surface that guides wind to the first heating element as a fan of the electronic device operates.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 14 is a sectional view of an electronic apparatus according to a comparative example.

DESCRIPTION OF EMBODIMENTS

There is a need to improve the cooling capability of a first heating element and a second heating element in an electronic apparatus. In view of the above, it is desirable to improve the cooling capability of the first heating element and the second heating element.

First, the following describes a configuration of an electronic apparatus according to an embodiment of the technology disclosed in the present application.

Figure 1:
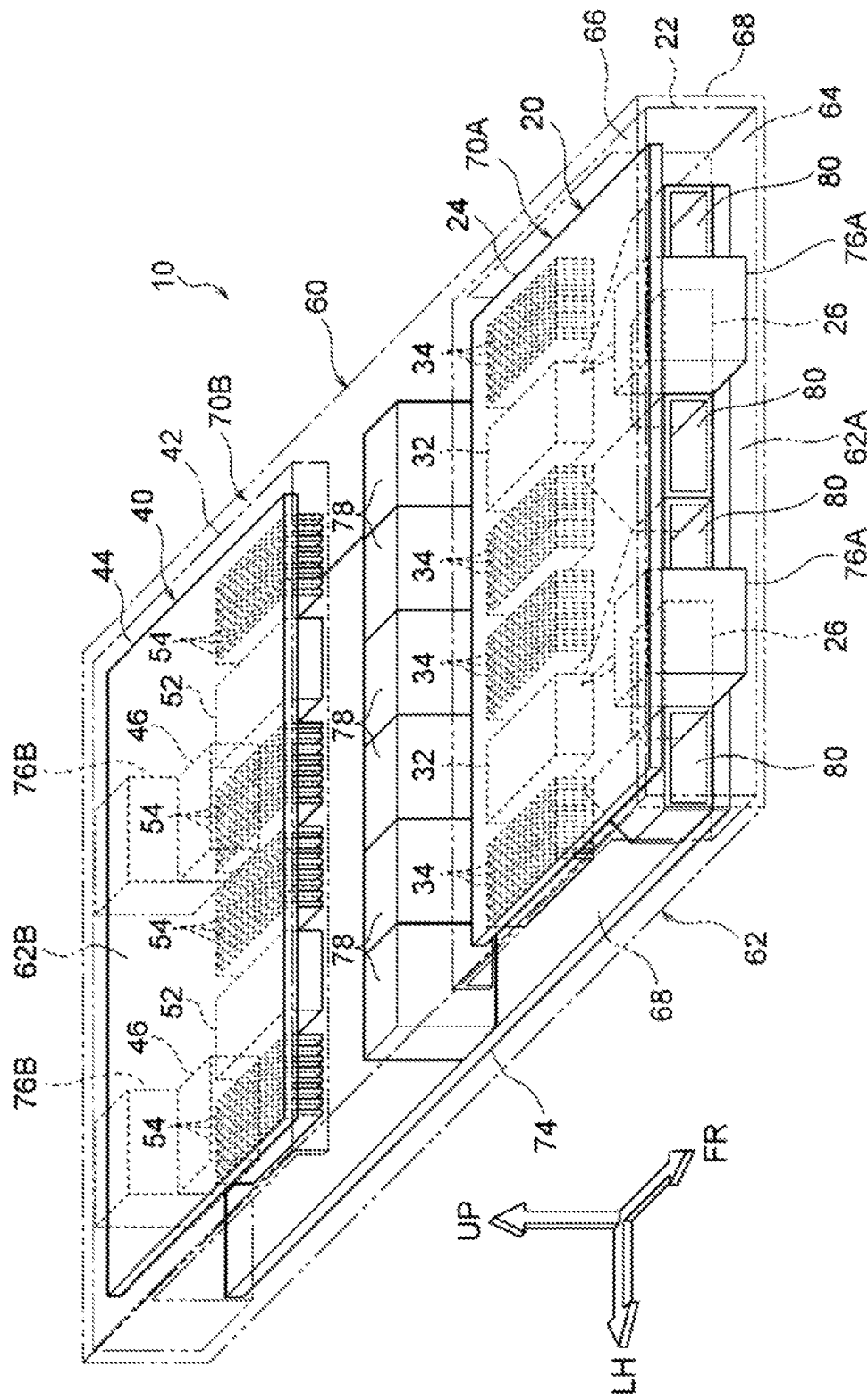
FIG. 1 is a schematic perspective view of an electronic apparatus according to the present embodiment.
Figure 2:
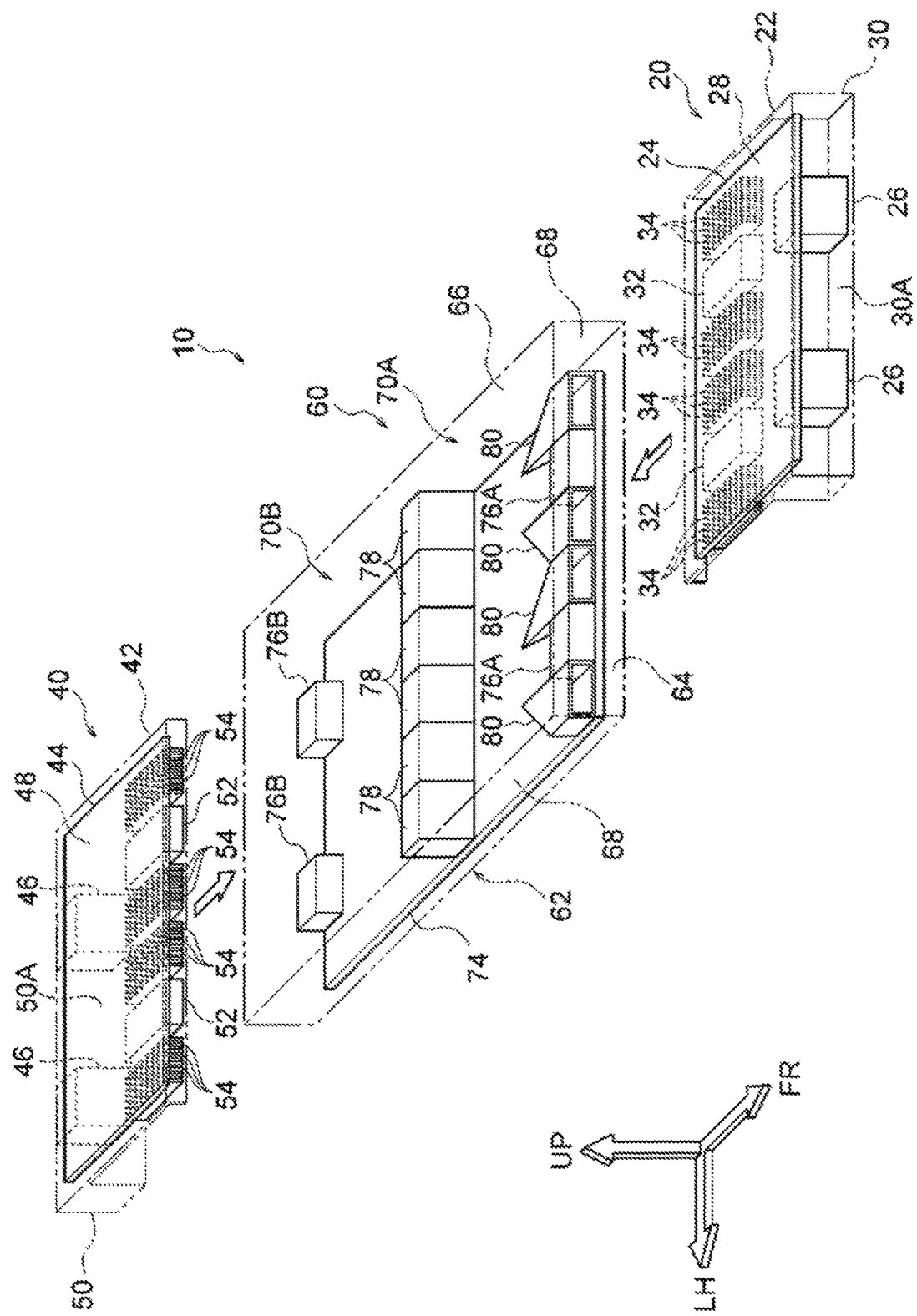
FIG. 2 is a view of a first unit, a second unit, and an electronic device of FIG. 1 before the first unit and the second unit are stored in the electronic device.

FIGS. 1 and 2 schematically illustrate an electronic apparatus 10 according to the present embodiment. Arrow FR indicates the front side in the front-back direction of the electronic apparatus 10 and its constituent elements. Arrow UP indicates the upper side in the vertical direction of the electronic apparatus 10 and its constituent element. Arrow LH indicates the left side in the left-right direction of the electronic apparatus 10 and its constituent elements.

The electronic apparatus 10 is, for example, a server. The electronic apparatus 10 includes a first unit 20, a second unit 40, and an electronic device 60. The electronic device 60 includes a housing 62 having a rectangular parallelepiped shape. The housing 62 is represented by imaginary lines in FIGS. 1 and 2 so as to facilitate understanding of the configuration of the electronic apparatus 10. The housing 62 includes a bottom wall 64, a top wall 66, and a pair of side walls 68. A front portion 62A and a rear portion 62B of the housing 62 are open in the front-back direction of the housing 62.

A first storage section 70A and a second storage section 70B are provided in the housing 62. The first storage section 70A is located on the front side of the electronic device 60. The second storage section 70B is located on the rear side of the electronic device 60. The front side of the electronic device 60 is an example of a "first side of an electronic device". The rear side of the electronic device 60 is an example of a "second side of the electronic device".

The first unit 20 is an example of an "electronic unit". The first, unit 20 is stored in the first storage section 70A from the front side of the housing 62. The second unit 40 is stored in the second storage section 70B from the rear side of the housing 62. FIG. 1 illustrates a state where the first unit 20 and the second unit 40 have been stored in the first storage section 70A and the second storage section 70B, respectively. FIG. 2 illustrates a state where the first unit 20 and the second unit 40 are yet to be stored in the first storage section 70A and the second storage section 70B, respectively.

A first frame 22 of the first unit 20 and a second frame 42 of the second unit 40 are each represented by imaginary lines in FIGS. 1 and 2 so as to facilitate understanding of the configurations of the first unit 20 and the second unit 40.

Figure 3:
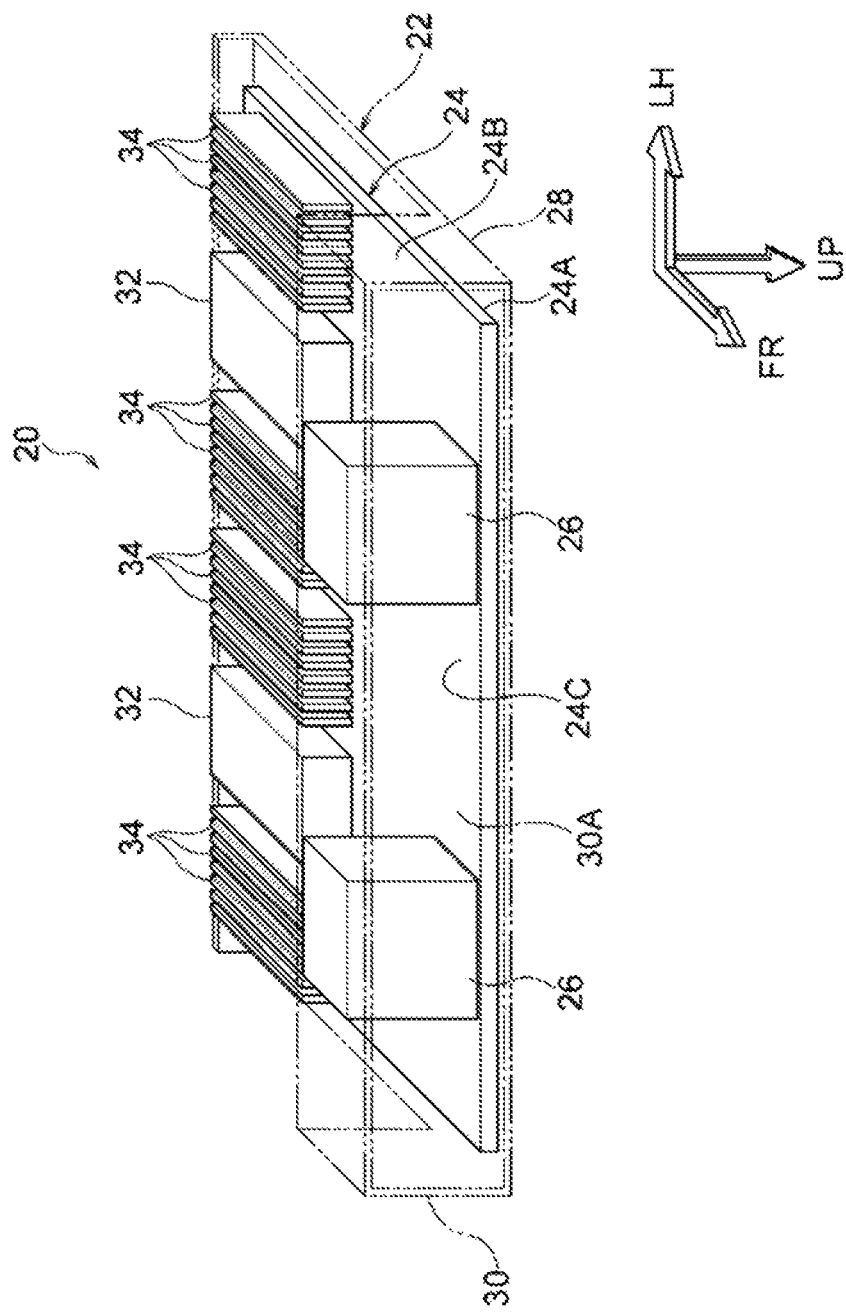
FIG. 3 is a perspective view of the first unit of FIGS. 1 and 2.

FIG. 3 illustrates the first unit 20 of FIGS. 1 and 2. The first unit 20 of FIGS. 1 and 2 is illustrated upside down in FIG. 3, The first unit 20 includes the first frame 22, a first board 24, and a pair of first connectors 26.

The first frame 22 includes a top wall 28 and a front cover 30. The top wall 28 is disposed along an upper surface 24A of the first board 24. The front cover 30 is disposed at the front end of the top wall 28. A front portion 30A of the front cover 30 is open in the front-back direction of the first unit 20.

The first board 24 is disposed such that the thickness direction thereof is identical to the vertical direction of the first unit 20. The first board 24 is, for example, a motherboard. A pair of first heating elements 32 and a plurality of first electronic parts 34 are mounted on a lower surface 24B of the first board 24. As an example, the first heating element 32 is a central processing unit (CPU), and the first electronic part 34 is a memory. The pair of first heating elements 32 is arranged in the left-right direction of the first unit 20. The plurality of first electronic parts 34 is disposed alongside the first heating elements 32.

The pair of first connectors 26 is mounted on the lower surface 24B of the first board 24. The pair of first connectors 26 is disposed at a front end 24C of the first board 24. The front end 24C of the first board 24 is an example of an "end on the first side of a first board". The pair of first connectors 26 is arranged in the left-right direction of the first unit 20.

The pair of first connectors 26 is disposed on the front side of the first heating elements 32 and the first electronic parts 34. The first connector 26 on the left side and the first heating element 32 on the left side are arranged side by side in the front-back direction of the first unit 20. The first connector 26 on the right side and the first heating element 32 on the right side are arranged side by side in the front-back direction of the first unit 20. Each of the first connectors 26 is disposed such that the width direction thereof is identical to the left-right direction of the first unit 20. Each of the first connectors 26 includes a plurality of connection terminals (not illustrated) facing the front side of the first unit 20.

Figure 4:
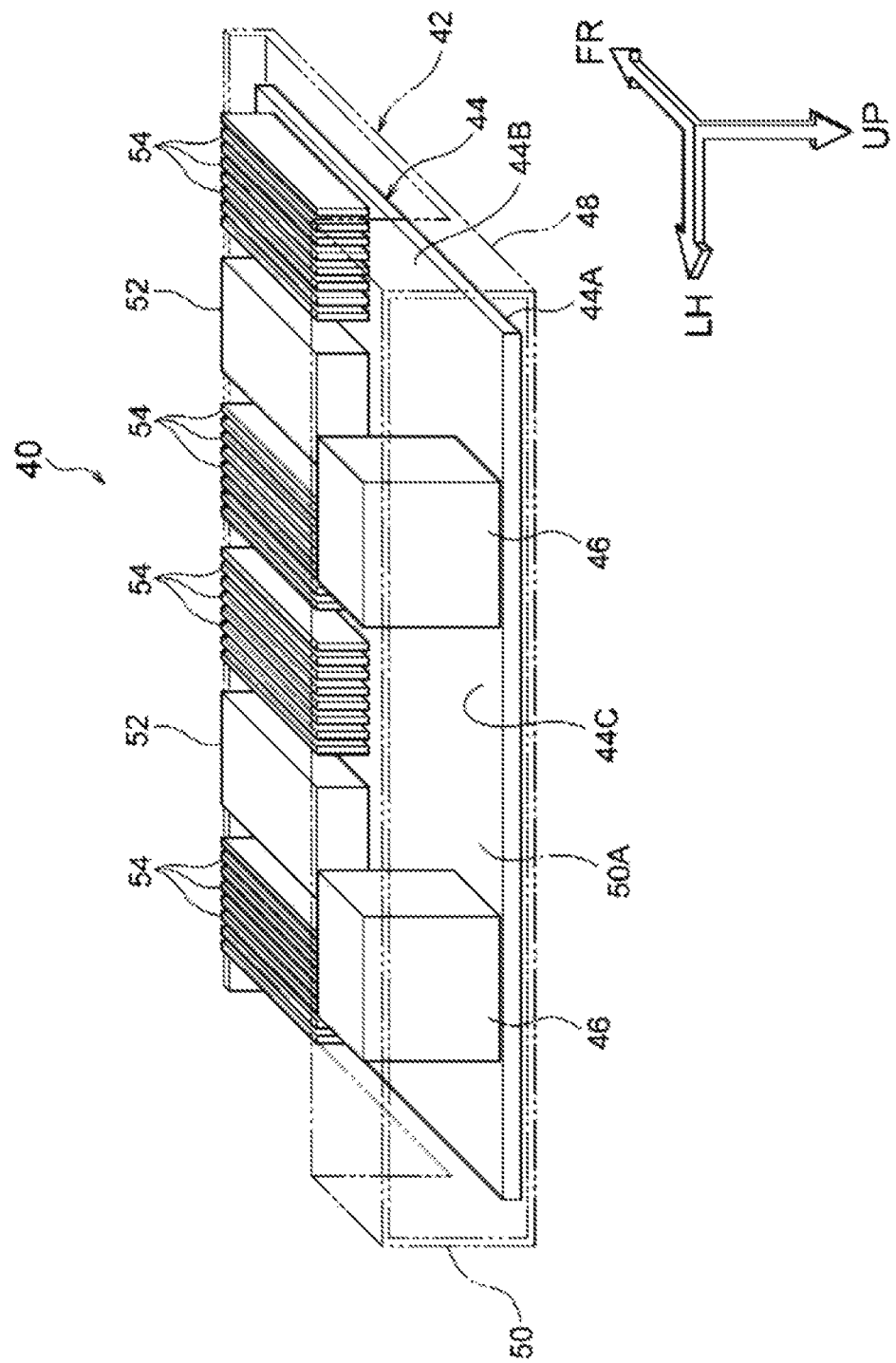
FIG. 4 is a perspective view of the second unit of FIGS. 1 and 2.

FIG. 4 illustrates the second unit 40 of FIGS. 1 and 2. The second unit 40 of FIGS. 1 and 2 is illustrated upside down and back to front in FIG. 4. The second unit 40 includes the second frame 42, a second board 44, and a pair of second connectors 46.

The second frame 42 includes a top wall 48 and a rear cover 50. The top wall 48 is disposed along an upper surface 44A of the second board 44. The rear cover 50 is disposed at the rear end of the top wall 48. A rear portion 50A of the rear cover 50 is open in the front-back direction of the second unit 40.

The second board 44 is disposed such that the thickness direction thereof is identical to the vertical direction of the second unit 40. The second board 44 is, for example, a motherboard. A pair of second heating elements 52 and a plurality of second electronic parts 54 are mounted on a lower surface 44B of the second board 44. As an example, the second heating element 52 is a central processing unit (CPU), and the second electronic part 54 is a memory. The pair of second heating elements 52 is arranged in the left-right direction of the second unit 40. The plurality of second electronic parts 54 is disposed alongside the second heating elements 52.

The pair of second connectors 46 is mounted on the lower surface 44B of the second board 44. The pair of second connectors 46 is disposed at a rear end 44C of the second board 44. The rear end 44C of the second board 44 is an example of an "end on the second side of a second board". The pair of second connectors 46 is arranged in the left-right direction of the second unit 40.

The pair of second connectors 46 is disposed on the rear side of the second heating elements 52 and the second electronic parts 54. The second connector 46 on the left side and the second heating element 52 on the left side are arranged side by side in the front-back direction of the second unit 40. The second connector 46 on the right side and the second heating element 52 on the right side are arranged side by side in the front-back direction of the second unit 40. Each of the second connectors 46 is disposed such that the width direction thereof is identical to the left-right direction of the second unit 40. Each of the second connectors 46 includes a plurality of connection terminals (not illustrated) facing the rear side of the second unit 40.

Figure 5:
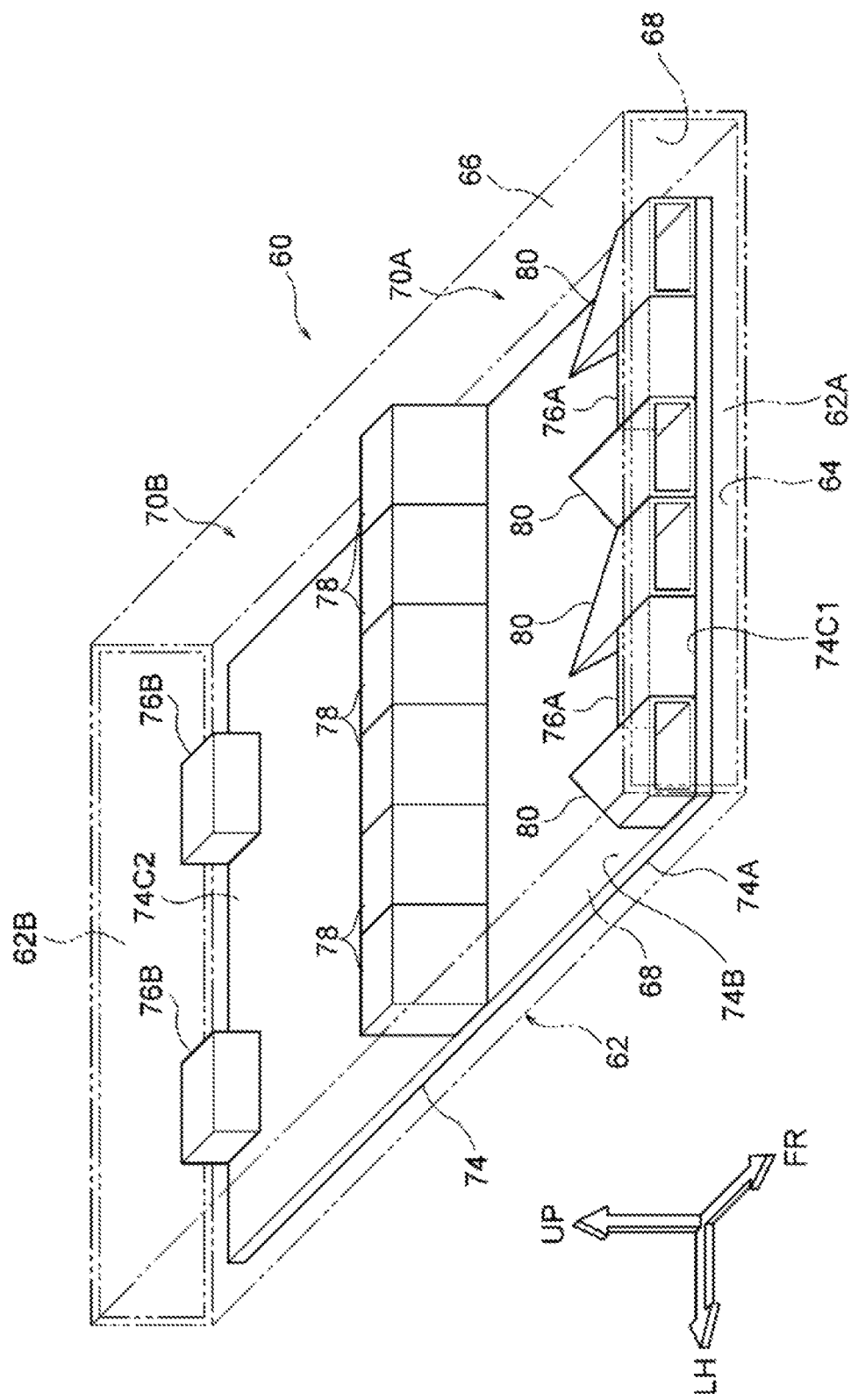
FIG. 5 is a perspective view of the electronic device of FIGS. 1 and 2.

FIG. 5 illustrates the electronic device 60 of FIGS. 1 and 2. The electronic device 60 is, for example, a server main body. The electronic device 60 includes, in addition to the housing 62 described above, a relay board 74, a pair of first relay connectors 76A, a pair of second relay connectors 76B, a plurality of fans 78, and a plurality of ducts 80.

The relay board 74 is disposed such that the thickness direction thereof is identical to the vertical direction of the electronic device 60. The relay board 74 is stored in the housing 62. The relay board 74 is located not on the top wall 66 side but on the bottom wall 64 side of the housing 62, and is disposed horizontally along the bottom wall 64. A lower surface 74A of the relay board 74 is located on the bottom wall 64 side. An upper surface 74B of the relay board 74 is located on a side opposite to the bottom wall 64. The pair of first relay connectors 76A, the pair of second relay connectors 76B, the plurality of fans 78, and the plurality of ducts 80 are mounted on the upper surface 74B of the relay board 74.

The pair of first relay connectors 76A is disposed at a front end 74C1 of the relay board 74. The front end 74C1 of the relay board 74 is an example of an "end on the first side of a relay board". The pair of first relay connectors 76A is arranged in the left-right direction of the electronic device 60. The pair of first relay connectors 76A is disposed on the front side of the fans 78. Each of the first relay connectors 76A is disposed such that the width direction thereof is identical to the left-right direction of the electronic device 60. Each of the first relay connectors 76A includes a plurality of connection terminals (not illustrated) facing the front side of the electronic device 60.

The pair of second relay connectors 76B is disposed at a rear end 74C2 of the relay board 74. The rear end 74C2 of the relay board 74 is an example of an "end on the second side of the relay board". The pair of second relay connectors 76B is arranged in the left-right direction of the electronic device 60. The pair of second relay connectors 76B is disposed on the rear side of the fans 78. Each of the second relay connectors 76B is disposed such that the width direction thereof is identical to the left-right direction of the electronic device 60. Each of the second relay connectors 76B includes a plurality of connection terminals (not illustrated) facing the rear side of the electronic device 60.

The plurality of fans 78 is disposed at the center in the front-back direction of the relay board 74. The plurality of fans 78 is arranged side by side in the left-right direction of the electronic device 60. The plurality of fans 78 is configured to operate to send wind from the front side to the rear side of the electronic device 60.

Figure 6:
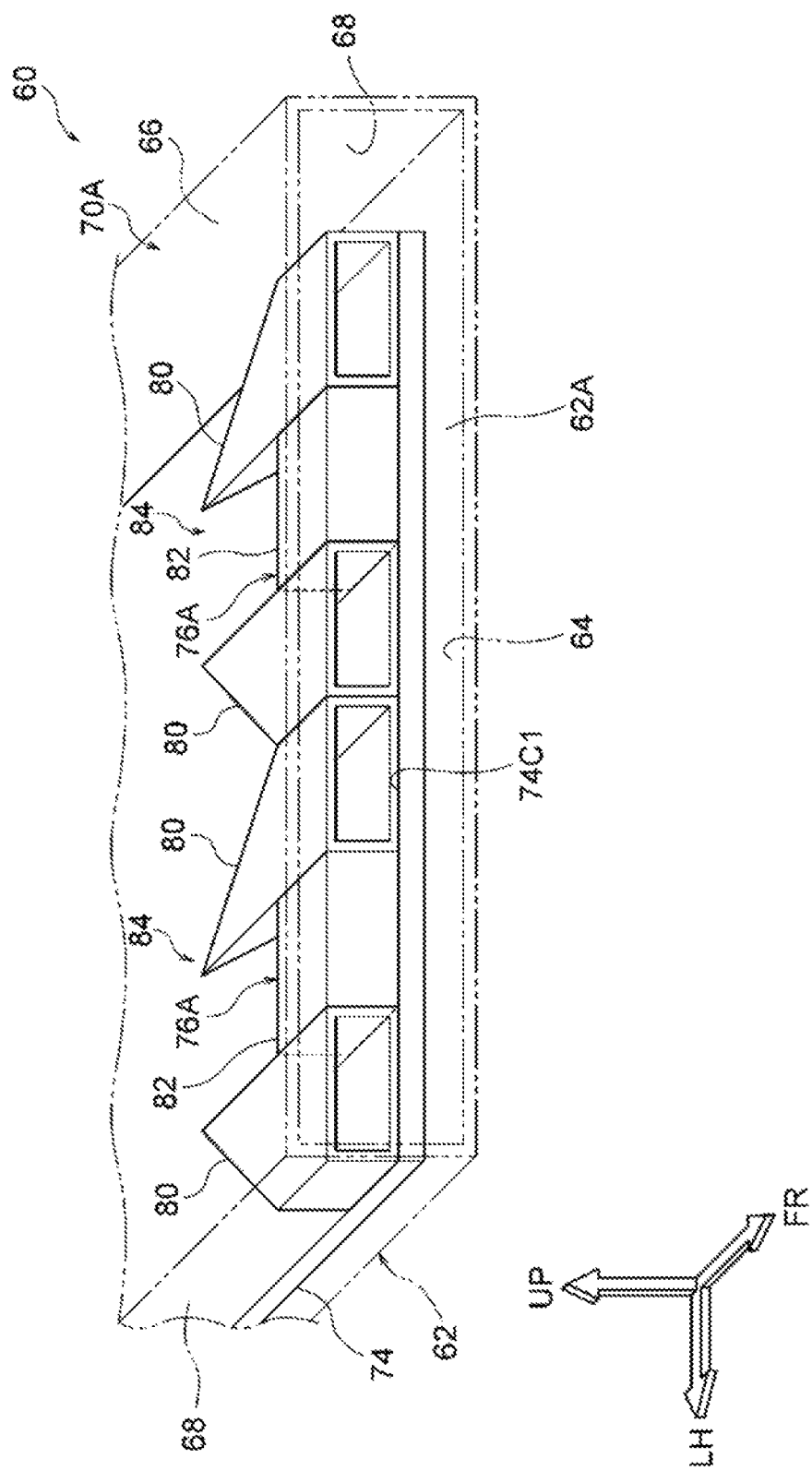
FIG. 6 is a perspective view of a front portion of the electronic device of FIG. 5.

FIG. 6 illustrates a front portion of the electronic device 60 of FIG. 5. The plurality of ducts 80 is disposed at the front end 74C1 of the relay board 74. Each of the ducts 80 is disposed alongside the first relay connector 76A in the left-right direction of the electronic device 60. Each of the ducts 80 is formed in a rectangular, cylindrical shape penetrating the electronic device 60 in the front-back direction.

Each of the first relay connectors 76A includes a connector case 82 enclosing a plurality of connection terminals (not illustrated). A pair of the ducts 80 disposed on both sides of the first relay connector 76A in the width direction thereof is formed integrally with the connector case 82. The pair of ducts 80 and the connector case 82 is formed of, for example, resin. The first relay connector 76A and the pair of ducts 80 form an integrated connector member 84.

Figure 7:
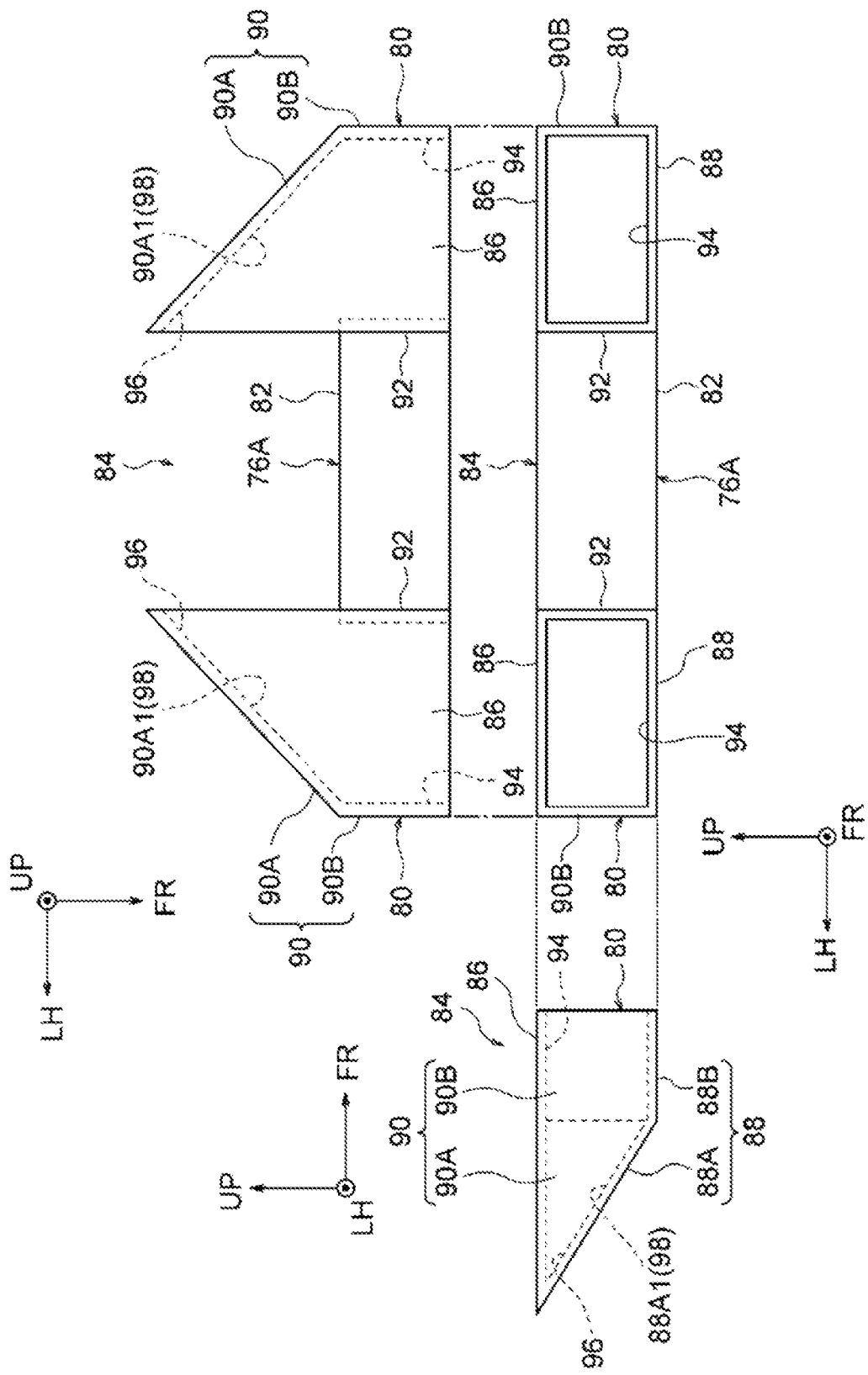
FIG. 7 is a three-view drawing of a connector member of FIG. 6.

FIG. 7 is a three-view drawing of the connector member 84 of FIG. 6. The pair of ducts 80 formed in the connector member 84 is formed symmetrically in the left-right direction of the connector member 84. The connector case 82 and the ducts 80 are each formed in a quadrangular shape in a front view. The front-back direction, the vertical direction, and the left-right direction of the connector member 84 are identical to the front-back direction, the vertical direction, and the left-right direction of the above-described electronic device 60 (see FIGS. 5 and 6).

For example, the duct 80 includes an upper wall 86, a lower wall 88, and a pair of side walls 90 and 92. Furthermore, of the pair of side walls 90 and 92, the side wall 90 located on a side opposite to the first relay connector 76A includes a rear side wall 90A and a front side wall 90B. The lower wall 88 includes a rear lower wall 88A and a front lower wall 88B. The upper wall 86, the front lower wall 88B, the front side wall 90B, and the side wall 92 extend in the front-back direction of the connector member 84.

Meanwhile, the rear side wall 90A is inclined with respect to the front-back direction of the connector member 84, in a plan view, to the center side in the left-right direction of the connector member 84 toward the rear side of the connector member 84. The rear side wall 90A is formed linearly in a plan view. Furthermore, the rear lower wall 88A is inclined with respect to the front-back direction of the connector member 84, in a side view, to the upper side of the connector member 84 toward the rear side of the connector member 84. The rear lower wall 88A is formed linearly in a side view.

An inlet 94 is formed at the front portion of the duct 80. An outlet 96 is formed between the rear end of the rear side wall 90A and the rear end of the side wall 92. An inner side surface 90A1 of the rear side wall 90A and an upper surface 88A1 of the rear lower wall 88A form a guide surface 98. The guide surface 98 guides wind that has entered the inside of, the duct 80 from the inlet 94 to the rear side and the upper side of the first relay connector 76A.

Figure 8:
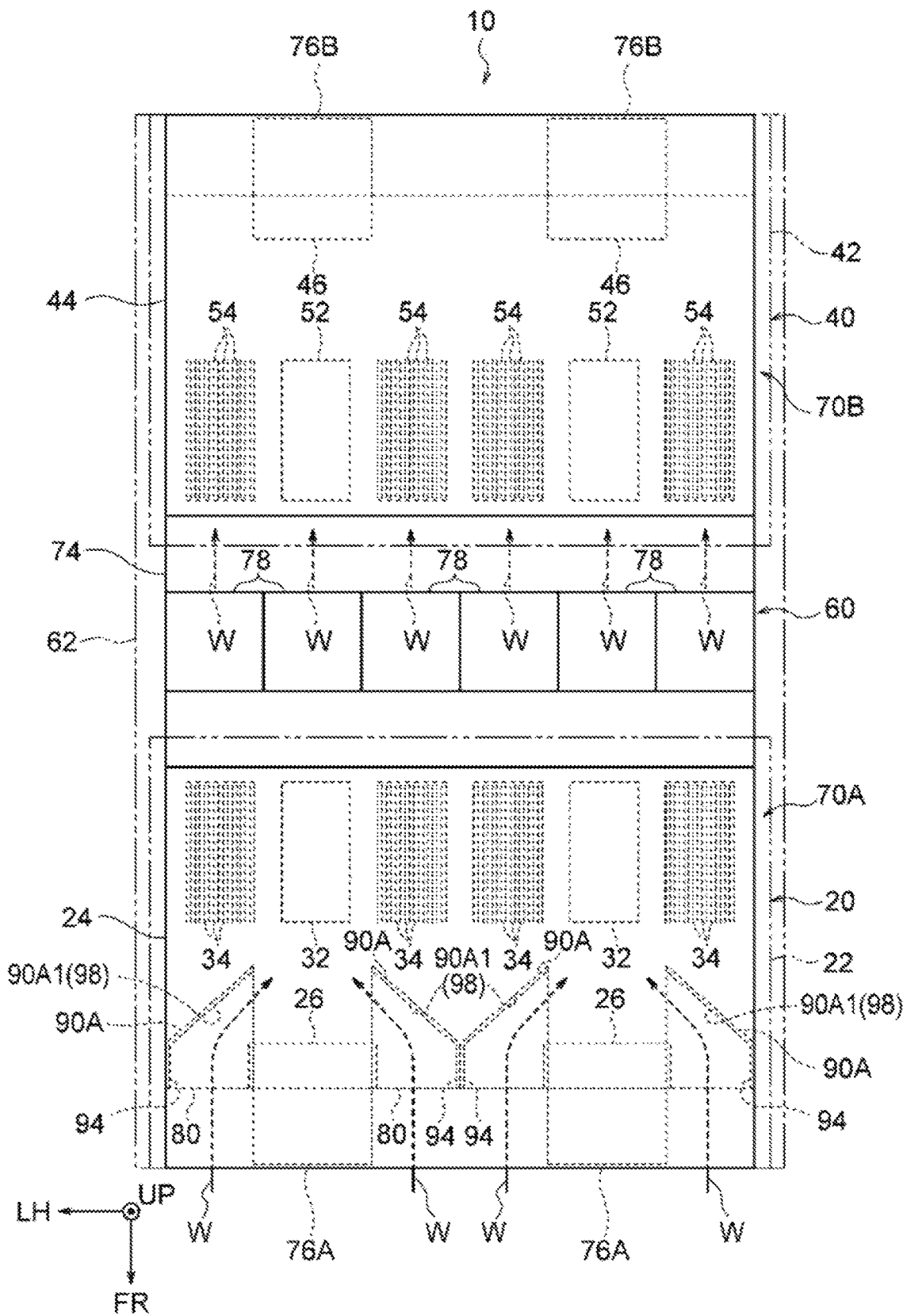
FIG. 8 is a plan view of the electronic device of FIG. 1, in which the flow of wind in the electronic device is illustrated.
Figure 9:
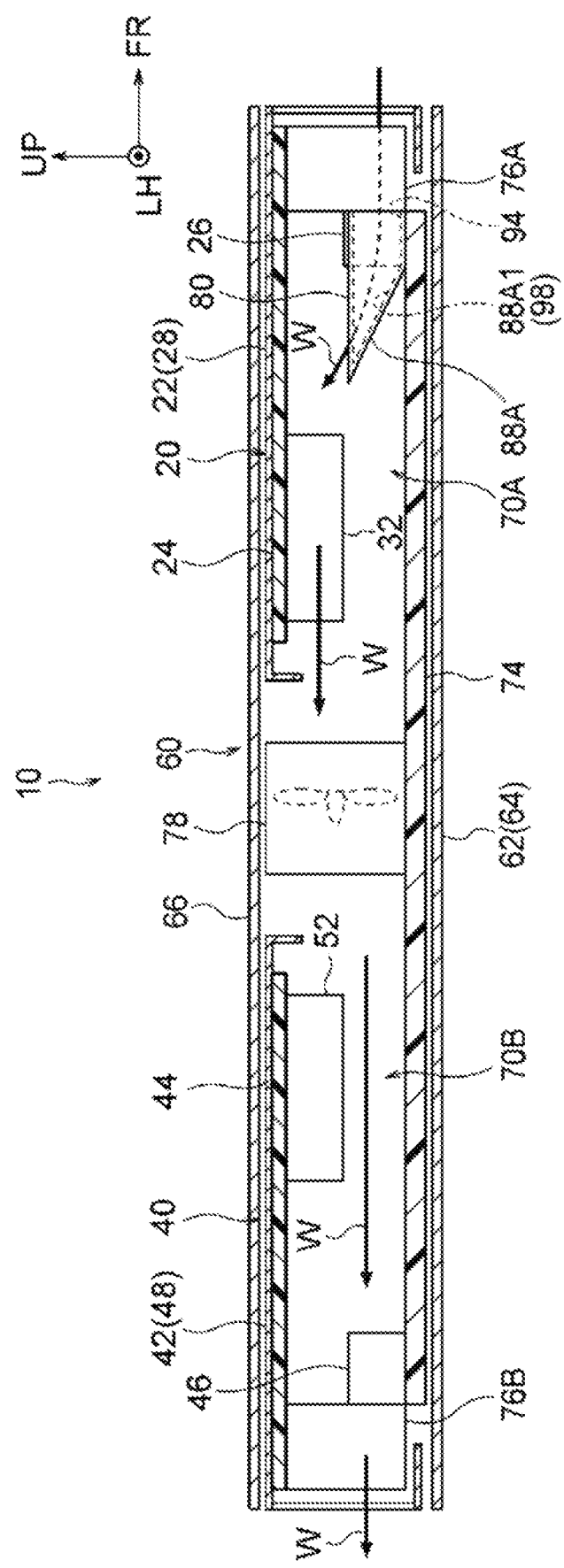
FIG. 9 is a sectional side view of the electronic device of FIG. 1, in which the flow of wind in the electronic device is illustrated.
Figure 10:
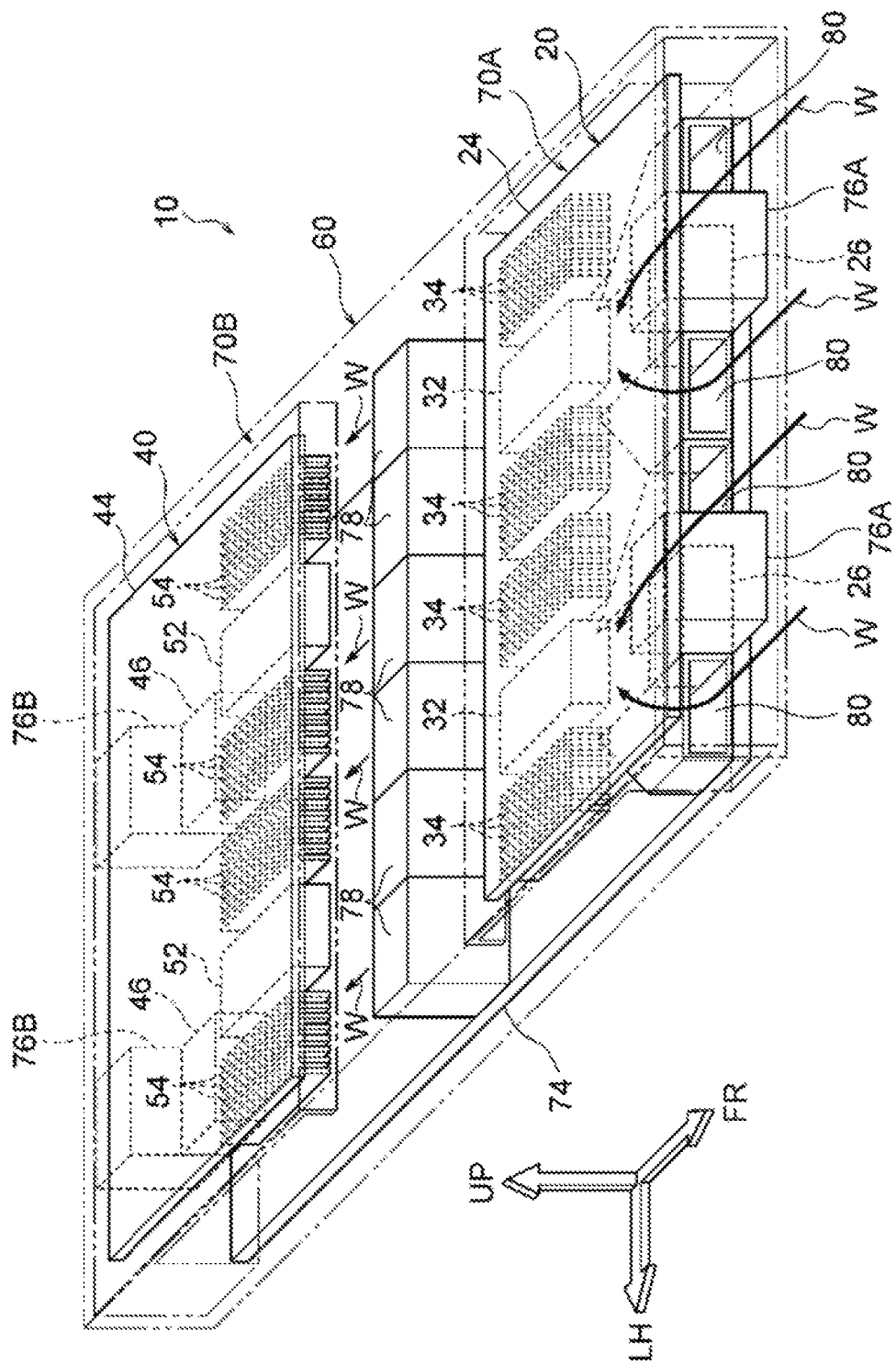
FIG. 10 is a perspective view of the electronic device of FIG. 1, in which the flow of wind in the electronic device is illustrated.

FIGS. 8 to 10 illustrate the flow of wind W in the electronic device 60 of FIG. 1. As described above, the first unit 20 is stored in the first storage section 70A from the front side of the housing 62. The second unit 40 is stored in the second storage section 70B from the rear side of the housing 62. When the first unit 20 is stored in the first storage section 70A, the first connector 26 is connected to the first relay connector 76A. When the second unit 40 is stored in the second storage section 70B, the second connector 46 is connected to the second relay connector 76B.

Furthermore, in a state where the first unit 20 is stored in the first storage section 70A and the second unit 40 is stored in the second storage section 70B, the first board 24 and the second board 44 are disposed to face the relay board 74. The first board 24 and the second board 44 are horizontally disposed along the top wall 66 of the housing 62. The fans 78 are located between the first board 24 and the second board 44.

Then, when the fans 78 operate, wind W is sent from the front side to the rear side of the electronic device 60. Here, as illustrated in FIG. 8, the ducts 80 and the first heating elements 32 are disposed in a staggered manner in the left-right direction of the electronic device 60 in a plan view. However, accordance with the staggered arrangement, the inner side surface 90A1 of the rear side wall 90A formed in the duct 80 is inclined with respect to the front-back direction of the electronic device 60 in a plan view.

Furthermore, as illustrated in FIG. 9, the duct 80 and the first heating element 32 are disposed in a staggered manner in the vertical direction of the electronic device 60 in a side view. However, in accordance with the staggered arrangement, the upper surface 88A1 of the rear lower wall 88A formed in the duct 80 is inclined with respect to the front-back direction of the electronic device 60 in a side view. The inner side surface 90A1 of the rear side wall 90A and the upper surface 88A1 of the rear lower wall 88A form the guide surface 98. The guide surface 98 guides wind W that has entered the inside of the duct 80 from the inlet 94 to the rear side and the upper side of the first relay connector 76A.

Then, the guide surface 98 guides wind W that has entered the inside of the duct 80 from the inlet 94 to the first heating element 32 located on the rear side and the upper side of the first relay connector 76A. Thus, wind W is supplied to the first heating element 32 (see also FIG. 10). Furthermore, the relay board 74 is disposed to face the first board 24 and the second board 44. Thus, there is avoided causing the relay board 74 to hinder the flow of wind W. As a result, wind W is also supplied to the second heating element 52. Then, as a result of supplying wind W to the first heating element 32 and the second heating element 52 as described above, the first heating element 32 and the second heating element 52 are cooled.

Next, operation and effect of the present embodiment will be described.

First, a comparative example will be described so as to clarify the operation and effect of the present embodiment. FIG. 14 is a sectional view of an electronic apparatus 110 according to a comparative example. The electronic apparatus 110 according to the comparative example includes a first unit 120, a second unit 140, and an electronic device 160 storing the first unit 120 and the second unit 140 arranged in the front-back direction.

The first unit 120 includes a first board 124 and a first connector 126. The second unit 140 includes a second board 144 and a second connector 146. A first heating element 132 is mounted on the first board 124. A second heating element 152 is mounted on the second board 144. The first board 124 and the second board 144 are horizontally disposed along the front-back direction of the electronic device 160. The first connector 126 is disposed at the rear end of the first board 124. The second connector 146 is disposed at the front end of the second board 144.

The electronic device 160 includes a first relay board 174A, a second relay board 174B, a first relay connector 176A, a second relay connector 176B, and a fan 178. The first relay board 174A, the second relay board 174B, and the fan 178 are disposed between the first board 124 and the second board 144. The first relay board 174A and the second relay board 174B are disposed adjacent to the fan 178 in front of and at the back of the fan 178, respectively. The first relay board 174A and the second relay board 174B are vertically disposed along the vertical direction of the electronic device 160.

The first relay connector 176A is disposed on the front surface of the first relay board 174A. The second relay connector 176B is disposed on the rear surface of the second relay board 174B. The first relay connector 176A is connected to the first connector 126. The second relay connector 176B is connected to the second connector 146. Then, when the fan 178 operates in the electronic apparatus 110 according to the comparative example, wind W is sent from the front side to the rear side of the electronic device 160. A ventilation hole 180 for letting wind W through is formed in each of the first relay board 174A and the second relay board 174B.

However, in the electronic apparatus 110 according to the comparative example, the first relay board 174A and the second relay board 174B are vertically disposed along the vertical direction of the electronic device 160. Therefore, the first relay board 174A and the second relay board 174B hinder the flow of wind W.

Furthermore, the ventilation holes 180 for letting wind W through, which are respectively formed in the first relay board 174A and the second relay board 174B, are located above the first heating element 132. Thus, wind W flows toward the ventilation holes 180. This may reduce the amount of wind W to be supplied to the first heating element 132.

Furthermore, the size of the ventilation holes 180 is limited by the influence of, for example, wiring formed on the first relay board 174A and the second relay board 174B, parts mounted on the first relay board 174A and the second relay board 174B, and the like. Thus, the amount of wind W that passes through the ventilation holes 180 is limited. This may reduce the amount of wind W to be supplied to the second heating element 152 located on the rear side of the first relay board 174A and the second relay board 174B.

Moreover, the first relay board 174A and the second relay board 174B are disposed vertically along the vertical direction of the electronic device 160. In addition, the first relay board 174A and the second relay board 174B are disposed adjacent to the fan 178. Therefore, areas in front of and at the back of the fan 178 may be poorly ventilated. Thus, the performance of the fan 178 may not be sufficiently exhibited. This also may reduce the amount of wind W to be supplied to the first heating element 132 and the second heating element 152.

Thus, in the electronic apparatus 110 according to the comparative example, there is a possibility that the amount of wind W to be supplied to the first heating element 132 and the second heating element 152 may be reduced, leading to insufficient cooling capability of the first heating element 132 and the second heating element 152. Therefore, it is desirable to improve the cooling capability of the first heating element 132 and the second heating element 152.

In contrast, according to the present embodiment illustrated in FIGS. 8 and 9 (see also FIG. 10 as appropriate), the duct 80 is disposed at the front end of the relay board 74. The duct 80 includes the guide surface 98 that guides wind W to the first heating element 32 as the fan 78 operates. Therefore, it is possible to supply wind W to the first, heating element 32 by causing the guide surface 98 to guide wind W.

Furthermore, the relay board 74 is disposed to face the first board 24 and the second board 44. For example, the relay board 74 is disposed horizontally along the front-back direction of the electronic device 60. Therefore, it is possible to avoid causing the relay board 74 to hinder the flow of wind W when the fan 78 operates. This enables wind W to be supplied to the second heating element 52.

Moreover, the first connector 26 and the first relay connector 76A are disposed at the front ends of the first board 24 and the relay board 74, respectively. In addition, the second connector 46 and the second relay connector 76B are disposed at the rear ends of the second board 44 and the relay board 74, respectively. For example, the first connector 26 and the first relay connector 76A, and the second connector 46 and the second relay connector 76B are each located away from the fan 78 located between the first board 24 and the second board 44. Therefore, it is possible to cause areas in front of and at the back of the fan 78 to be well-ventilated. This enables the performance of the fan 78 to be sufficiently exhibited.

As described above, it is possible to supply a sufficient amount of wind W to the first heating element 32 and the second heating element 52. Thus, it is possible to improve the cooling capability of the first heating, element 32 and the second heating element 52 as compared with the comparative example.

Furthermore, as illustrated in FIG. 8, a pair of the ducts 80 is disposed on both sides of each first relay connector 76A in the width direction thereof so as to correspond to each first heating element 32. Therefore, it is possible to increase the amount of wind W to be supplied to the first heating element 32. Thus, it is possible to further improve the cooling capability of the first heating element 32.

Furthermore, as illustrated in FIG. 6, the first relay connector 76A includes the connector case 82. The ducts 80 are formed integrally with the connector case 82. Therefore, compared to the case where the ducts 80 are independent of the connector case 82, it is possible to miniaturize the connector member 84 including the ducts 80 and the connector case 82. This enables parts to be more densely mounted on the relay board 74.

Furthermore, the housing 62 of the electronic device 60 includes the bottom wall 64 and the top wall 66. The relay board 74 is disposed along the bottom wall 64. Therefore, compared to the case where, for example, the relay board 74 is disposed along the top wall 66 and fixed on the top wall 66, it is possible to simplify the structure of a fixing part where the relay board 74 is fixed. This is because the bottom wall 64 supports the relay board 74 from below.

Next, modifications of the present embodiment will be described.

First Modification

Figure 11:
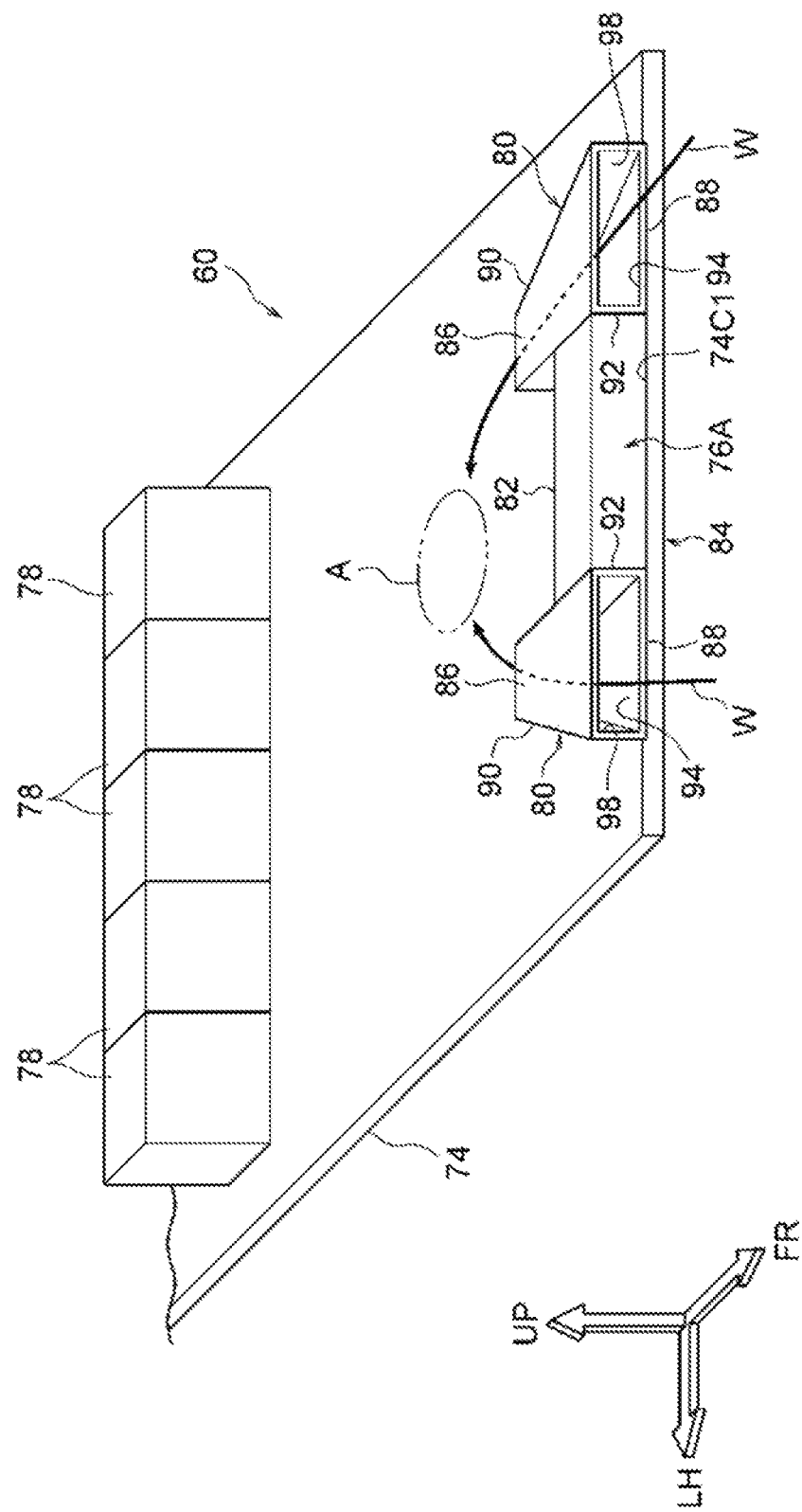
FIG. 11 is a perspective view of a front half of an electronic device according to a first modification of the present embodiment.
Figure 12:
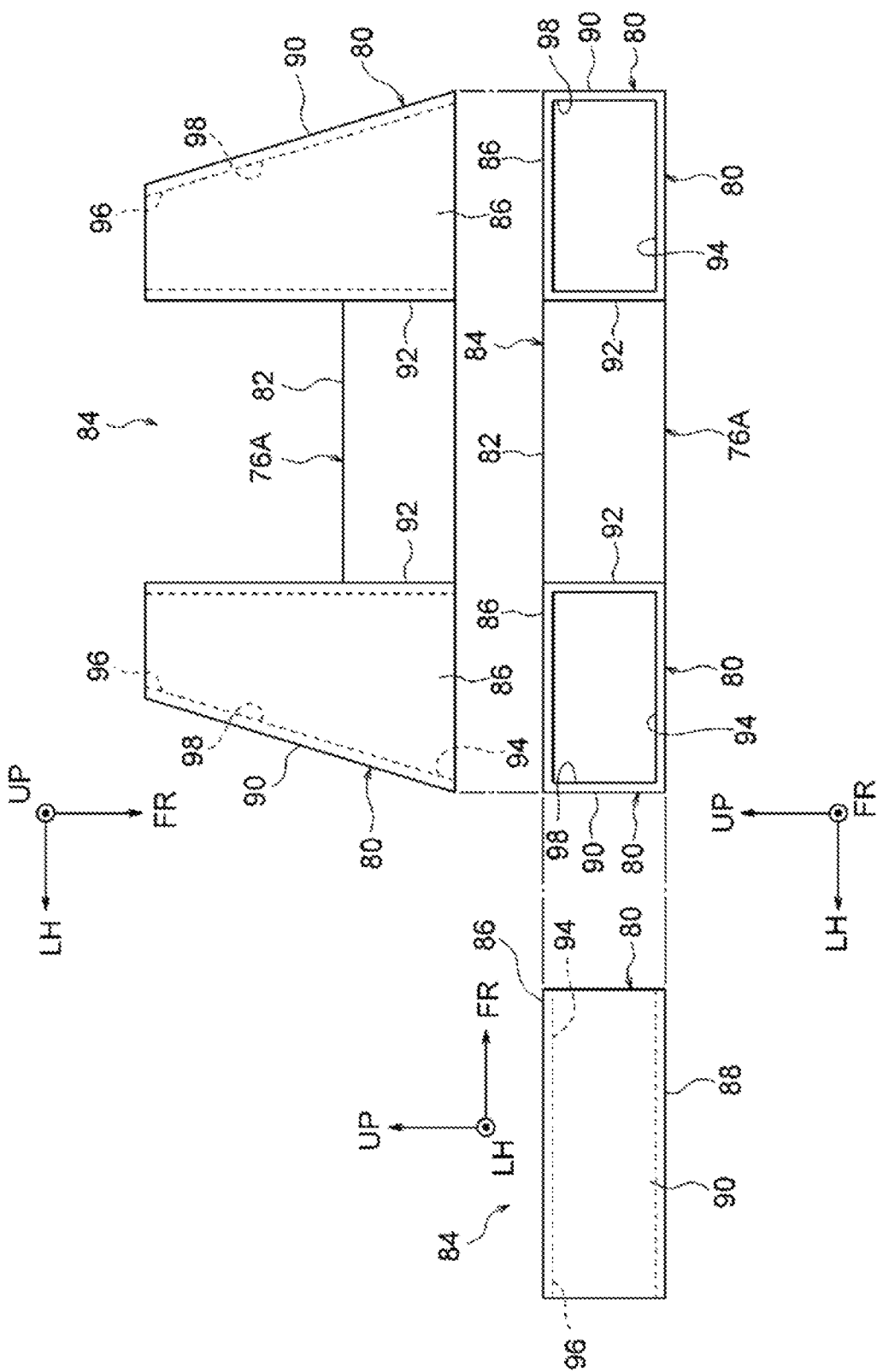
FIG. 12 is a three-view drawing of a connector member of FIG. 11.

FIG. 11 illustrates a front half of an electronic device 60 according to a first modification of the present embodiment. In the first modification, a single connector member 84 is disposed at a front end 74C1 of a relay board 74. FIG. 12 illustrates the connector member 84 of FIG. 11. A pair of ducts 80 of the connector member 84 is formed symmetrically in the left-right direction of the connector member 84.

In each of the ducts 80, an upper wall 86, a lower wall 88, and a side wall 92 extend along the front-back direction of the connector member 84. Meanwhile, a side wall 90 is inclined with respect to the front-back direction of the connector member 84, in a plan view, to the center side in the left-right direction of the connector member 84 toward the rear side of the connector member 84. The side wall 90 is formed linearly in a plan view.

An inlet 94 is formed at the front portion of the duct 80. An outlet 96 is formed at the rear portion of the duct 80. The inner side surface of the side wall 90 forms a guide surface 98 that guides wind W having entered the inside of the duct 80 from the inlet 94 to the rear side of a first relay connector 76A.

According to the first modification, it is possible to supply wind to area A on the rear side of the first relay connector 76A by causing the guide surface 98 to guide wind W, as illustrated in FIG. 11. Therefore, when a first heating element 32 (see FIG. 10) is disposed in area A on the rear side of the first relay connector 76A, it is possible to supply wind W to the first heating element 32.

Note that in the first modification described above, the side wall 90 forming the guide surface 98 is formed linearly in a plan view, and is inclined with respect to the front-back direction of the connector member 84. However, the side wall 90 may be curved with respect to the front-back direction of the connector member 84, in a plan view, to the center side in the left-right direction of the connector member 84 toward the rear side of the connector member 84.

Second Modification

Figure 13:
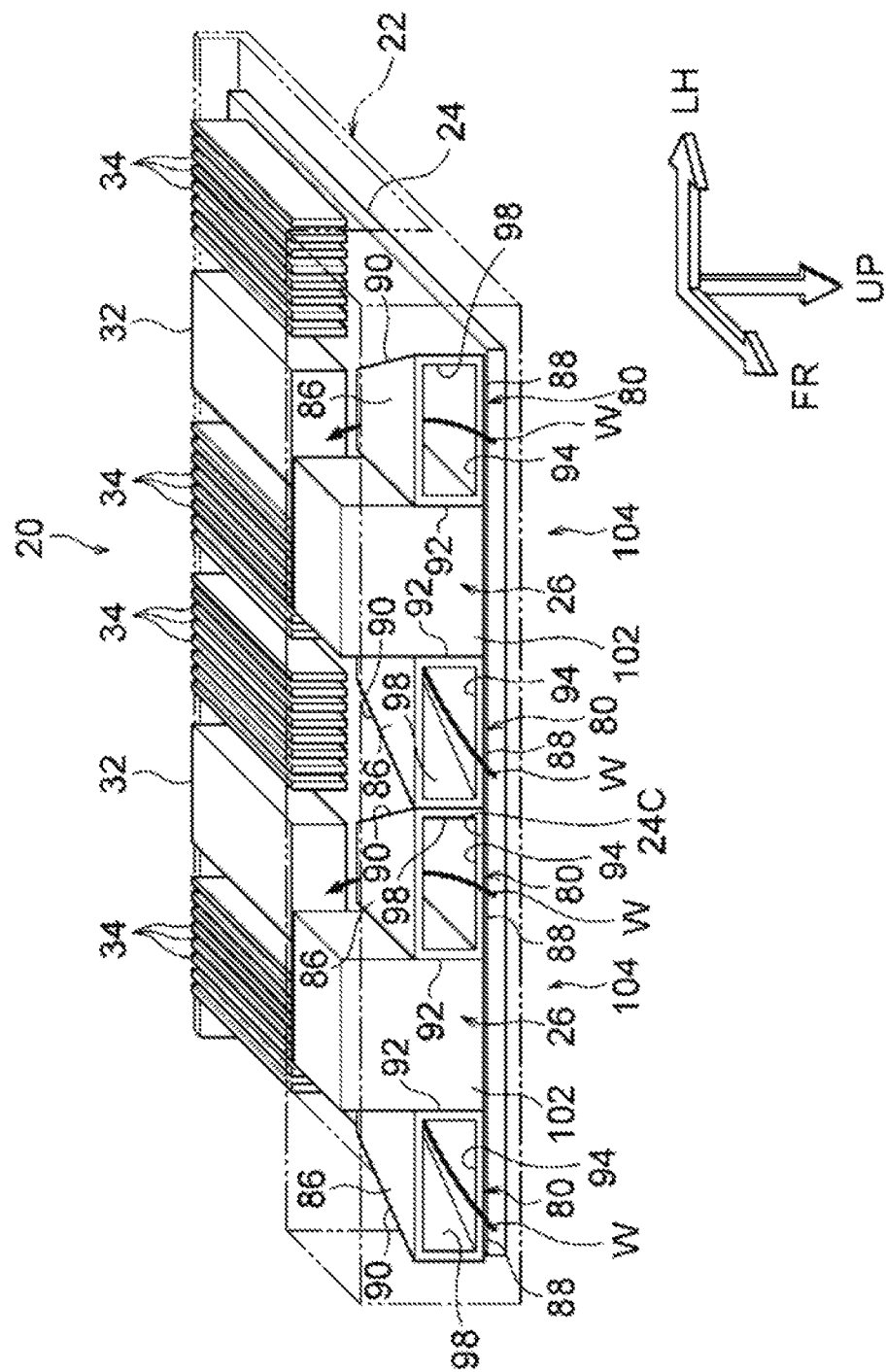
FIG. 13 is a perspective view of a first unit according to a second modification of the present embodiment.

FIG. 13 illustrates a first unit 20 according to a second modification of the present embodiment. In the second modification, a plurality of ducts 80 is disposed at a front end 24C of a first board 24. Each of the ducts 80 is disposed alongside a first connector 26 in the left-right direction of the first unit 20.

Each first connector 26 includes a connector case 102 enclosing a plurality of connection terminals (not illustrated). A pair of the ducts 80 disposed on both sides of the first connector 26 in the width direction thereof is formed integrally with the connector case 102. The pair of ducts 80 and the connector case 102 is formed of, for example, resin. The first connector 26 and the pair of ducts 80 form a connector member 104. The pair of ducts 80 formed in the connector member 104 is formed symmetrically in the left-right direction of the connector member 104.

In each of the ducts 80, an upper wall 86, a lower wall 88, and a side wall 92 extend along the front-back direction of the connector member 104. Meanwhile, a side wall 90 is inclined with respect to the front-back direction of the connector member 104, in a plan view, to the center side in the left-right direction of the connector member 104 toward the rear side of the connector member 104.

An inlet 94 is formed at the front portion of the duct 80. An outlet is formed at the rear portion of the duct 80. The inner side surface of the side wall 90 forms a guide surface 98 that guides wind W having entered the inside of the duct 80 from the inlet 94 to the rear side of the first connector 26.

According to the second modification, it is possible to supply wind W to a first heating element 32 disposed in an area on the rear side of a first relay connector 76A by causing the guide surface 98 to guide wind W.

Note that in the second modification described above, the side wall 90 forming the guide surface 98 is formed linearly in a plan view, and is inclined with respect to the front-back direction of the connector member 104. However, the side wall 90 may be curved with respect to the front-back direction of the connector member 104, in a plan view, to the center side in the left-right direction of the connector member 104 toward the rear side of the connector member 104.

Furthermore, although formed integrally with the connector case 102 in the second modification described above, the ducts 80 may be formed separately from the connector case 102.

Other Modifications

As illustrated in FIG. 9, in the above-described embodiment, the first unit 20 is stored on the front side of the electronic device 60. In addition, the second unit 40 is stored on the rear side of the electronic device 60. However, the first unit 20 may be stored on the rear side of the electronic device 60. In addition, the second unit 40 may be stored on the front side of the electronic device 60. Correspondingly, the plurality of ducts 80 may be disposed at the rear end of the relay board 74. In addition, the fan 78 may operate to send wind from the rear side to the front side of the electronic device 60 accordingly. In this case, the rear side of the electronic device 60 is an example of the "first side of the electronic device". In addition, the front side of the electronic device 60 is an example of the "second side of the electronic device".

Furthermore, in the above-described embodiment, the rear side wall 90A forming the guide surface 98 is formed linearly in a plan view, and is inclined with respect to the front-back direction of the connector member 84, as illustrated in FIG. 7. However, the side wall 90 may be curved with respect to the front-back direction of the connector member 84, in a plan view, to the center side in the left-right direction of the connector member 84 toward the rear side of the connector member 84.

Furthermore, in the above-described embodiment, the rear lower wall 88A forming the guide surface 98 is formed linearly in a side view, and is inclined with respect to the front-back direction of the connector member 84. However, the rear lower wall 88A may be curved with respect to the front-back direction of the connector member 84, in a side view, to the upper side of the connector member 84 toward the rear side of the connector member 84.

Furthermore, in the above-described embodiment, the guide surface 98 may have any shape as long as it is possible for the guide surface 98 to guide wind to the first heating element 32 as the fan 78 operates.

In addition, although formed integrally with the connector case 82 lip the above-described embodiment the ducts 80 may be formed separately from the connector case 82.

Moreover, in the above-described embodiment, a pair of the ducts 80 is provided to correspond to each first heating element 32, as illustrated in FIG. 8. However, the number, of the ducts 80 corresponding to each first heating element 32 may be any number.

Furthermore, some of the plurality of modifications described above may be appropriately combined as long as it is possible to combine the modifications.

Next, an example of the present embodiment will be described.

In the present example, a cooling simulation has been performed for the above-described embodiment (see FIGS. 1 to 10). In the cooling simulation according to the present example, the amounts of heat to be generated by the first heating element and the second heating element have been set to 250 W.

Furthermore, for comparison with the present example, a cooling simulation has also been performed for the above-described comparative example (see FIG. 14). In the cooling simulation according to the present comparative example, the aperture ratio of the ventilation holes formed in the relay board, which is the ratio of the opening area of the ventilation holes to the plane area of the relay board, has been set to 25%. In addition, the amounts of heat to be generated by the first heating element and the second heating element have been set to 250 W. Other conditions in the cooling simulation according to the present comparative example are the same as in the cooling simulation according to the present example.

Table 1 illustrates the results of both cooling simulations. As illustrated in Table 1, according to the present example, air volume may be 1.8 times as large as that in the comparative example (an increase of 0.1 m³/s), pressure loss may decrease by 35% (a decrease of 223 Pa) from that in the comparative example, and the temperatures of the first heating element and the second heating element may decrease by up to 8.8° C. from those in the comparative example. Thus, it has been confirmed that it is possible to achieve high cooling efficiency.

TABLE 1

|  | Temperature [° C.] | | | | | |
| --- | --- | --- | --- | --- | --- | --- |
|  | First Heating Element (No. 1) | First Heating Element (No. 2) | Second Heating Element (No. 3) | Second Heating Element (No. 4) | Air Volume [m³/s] | Pressure Loss [Pa] |
| Present Example (A) | 67.6 | 67.3 | 81.5 | 81.2 | 0.13 | 636 |
| Comparative Example (B) | 60.4 | 59.6 | 72.7 | 72.7 | 0.23 | 413 |
| Difference (B − A) | −7.2 | −7.7 | −8.8 | −8.5 | 0.1 | −223 |

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An electronic apparatus comprising:
a first unit;
a second unit; and
an electronic device that includes a first storage section in which the first unit is stored and a second storage section in which the second unit is stored, the first storage section being provided on a first side, the second storage section being provided on a second side opposite to the first side,
the first unit includes:
a first board on which a first heating element is mounted; and
a first connector disposed at an end on the first side of the first board,
the second unit includes:
a second board on which second heating element is mounted; and
a second connector disposed at an end on the second side of the second board,
the electronic device includes:
a relay board disposed to face the first board and the second board;
a first relay connector disposed at an end on the first side of the relay board and connected to the first connector;
a second relay connector disposed at an end on the second side of the relay board and connected to the second connector; and
a fan mounted on the relay board, located between the first board and the second board, and configured to operate to send wind from the first side to the second side of the electronic device, and a duct is disposed at the end on the first side of the relay board or at the, end on the first side of the first board, the duct having a guide surface that guides the wind to the first heating element as the fan operates,
the first relay connector or the first connector includes a connector case, and the duct is formed integrally with the connector case.

2. The electronic apparatus according to claim 1, wherein a pair of the ducts is disposed on both sides of the first relay connector a width direction of the first relay connector on the relay board or on both sides of the first connector in a width direction of the first connector on the first board.

3. The electronic apparatus according to claim 1, wherein the electronic device includes a housing including a bottom wall and a top wall, and the relay board is disposed along the bottom wall, and is fixed on the bottom wall.

4. An electronic unit to be stored in a first storage section of an electronic device that includes the first storage section on a first side and a second storage section on a second side opposite to the first side, the electronic unit comprising:
a first board on which a first heating element is mounted;
a first connector disposed at an end on the first side of the first board; and
a duct disposed at the end on the first side of the first board, the duct having a guide surface that guides wind to the first heating element as a fan of the electronic device operates,
the first relay connector or the first connector includes a connector case, and the duct is formed integrally with the connector case.

* * * * *